(12) United States Patent
Qu

(10) Patent No.: US 6,292,061 B1
(45) Date of Patent: Sep. 18, 2001

(54) LOW-VOLTAGE CMOS PHASE-LOCKED LOOP (PLL) FOR HIGH-PERFORMANCE MICROPROCESSOR CLOCK GENERATION

(75) Inventor: Ming Qu, San Jose, CA (US)

(73) Assignee: Sandcraft, Inc., Santa Clara, CA (US)

( * ) Notice: Subject to any disclaimer, the term of this patent is extended or adjusted under 35 U.S.C. 154(b) by 0 days.

(21) Appl. No.: 09/562,055

(22) Filed: May 1, 2000

(51) Int. Cl.[7] .............................. H03L 7/08; H03L 7/089

(52) U.S. Cl. .......................... 331/17; 331/1 A; 331/8; 331/25; 327/156; 327/157

(58) Field of Search .................. 331/1 A, 8, 17, 331/18, 25; 327/156–159; 360/51; 375/376; 455/260

(56) References Cited

U.S. PATENT DOCUMENTS

| | | | |
|---|---|---|---|
| 5,933,037 | * | 8/1999 | Momtaz ............................. 327/157 |
| 5,945,855 | * | 8/1999 | Momtaz ............................. 327/157 |
| 6,188,739 | * | 2/2001 | Everitt et al. ..................... 375/376 |

* cited by examiner

*Primary Examiner*—David Mis
(74) *Attorney, Agent, or Firm*—Fernandez & Associates, LLP.

(57) ABSTRACT

A PLL is implemented as a full differential circuit to improve the jitter performance and the operating voltage range. A process-compensated common-mode feedback is designed in the differential charge pump which together with loop filter of MOSFET capacitors maximizes the dynamic voltage range. A high-frequency divider capable of divide-mode change-on-flight is developed with eight divide mode programmability. A PLL start-up control circuit makes the PLL start and work under difficult conditions.

4 Claims, 5 Drawing Sheets

Differential Charge Pump and Loop Filter

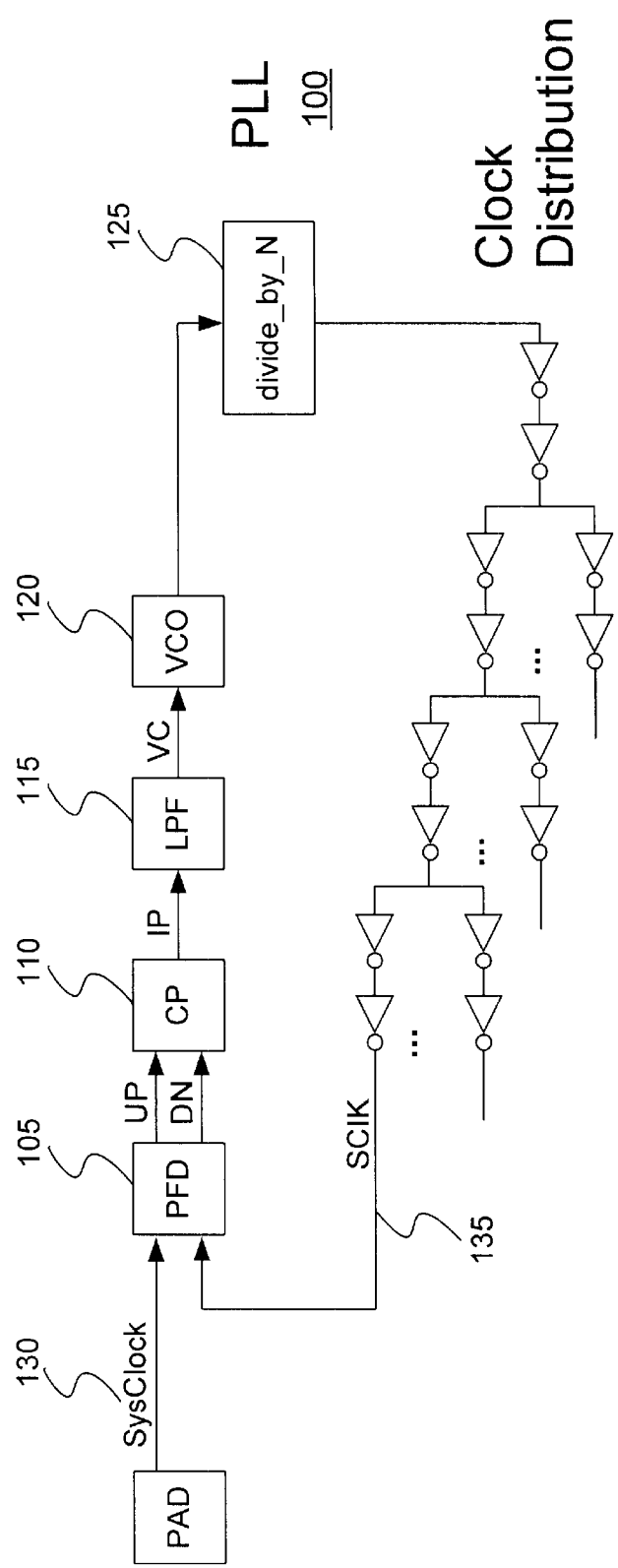
FIG. 1 Phase Locked Loop for On-Chip Clock Generation

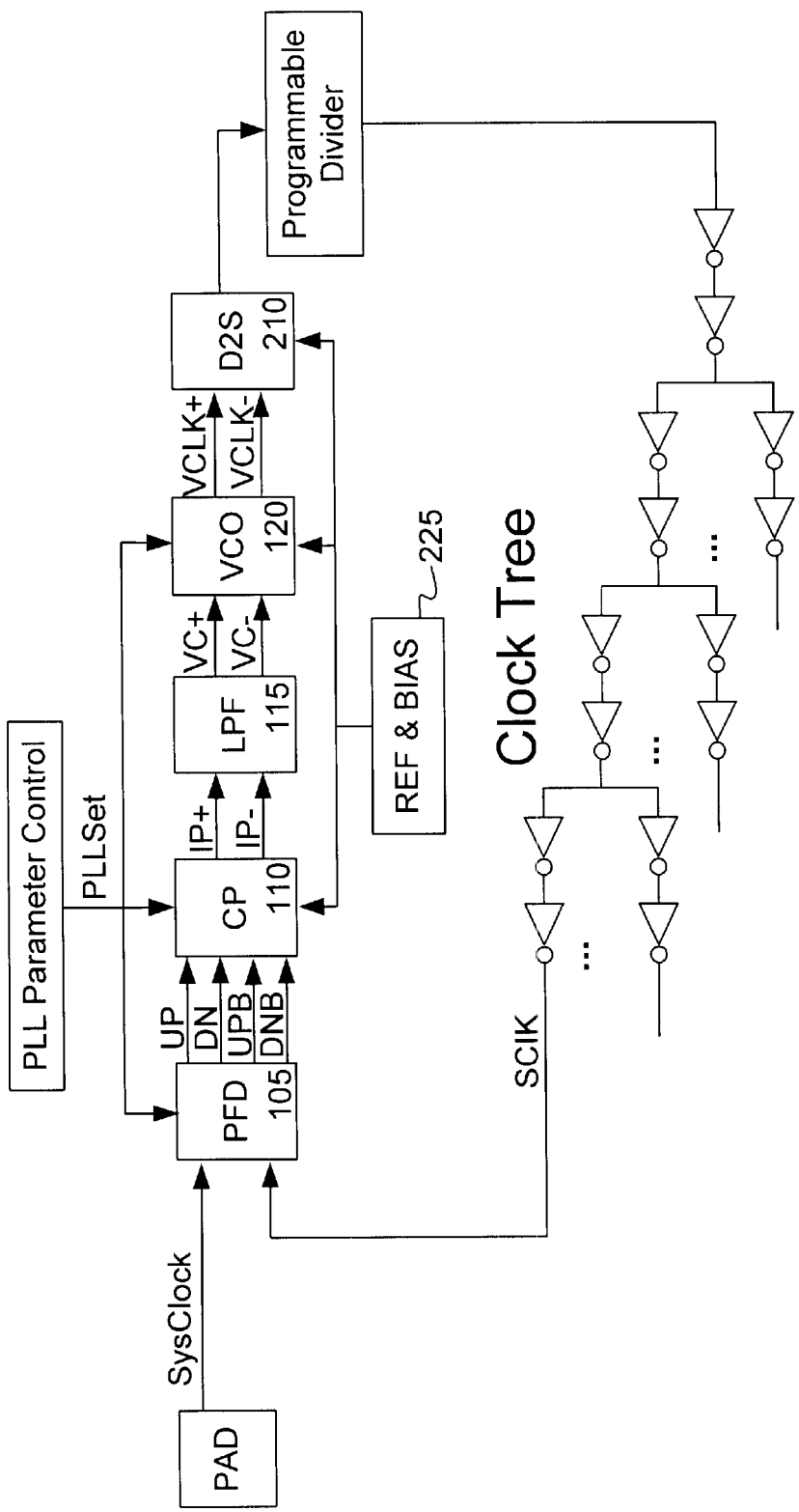
FIG. 2 Charge-Pump Phase Locked Loop Diagram

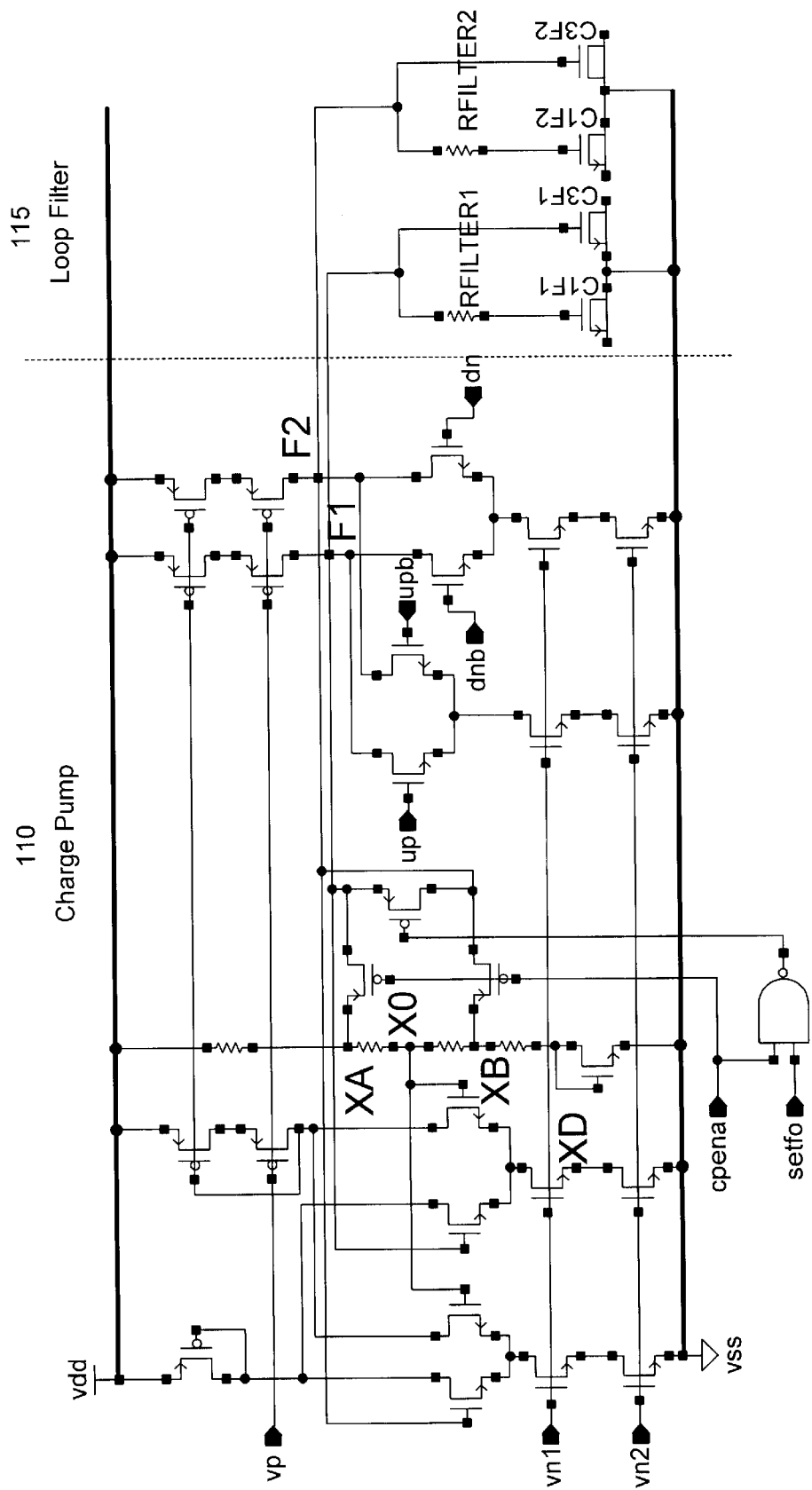
FIG.3 Differential Charge Pump and Loop Filter

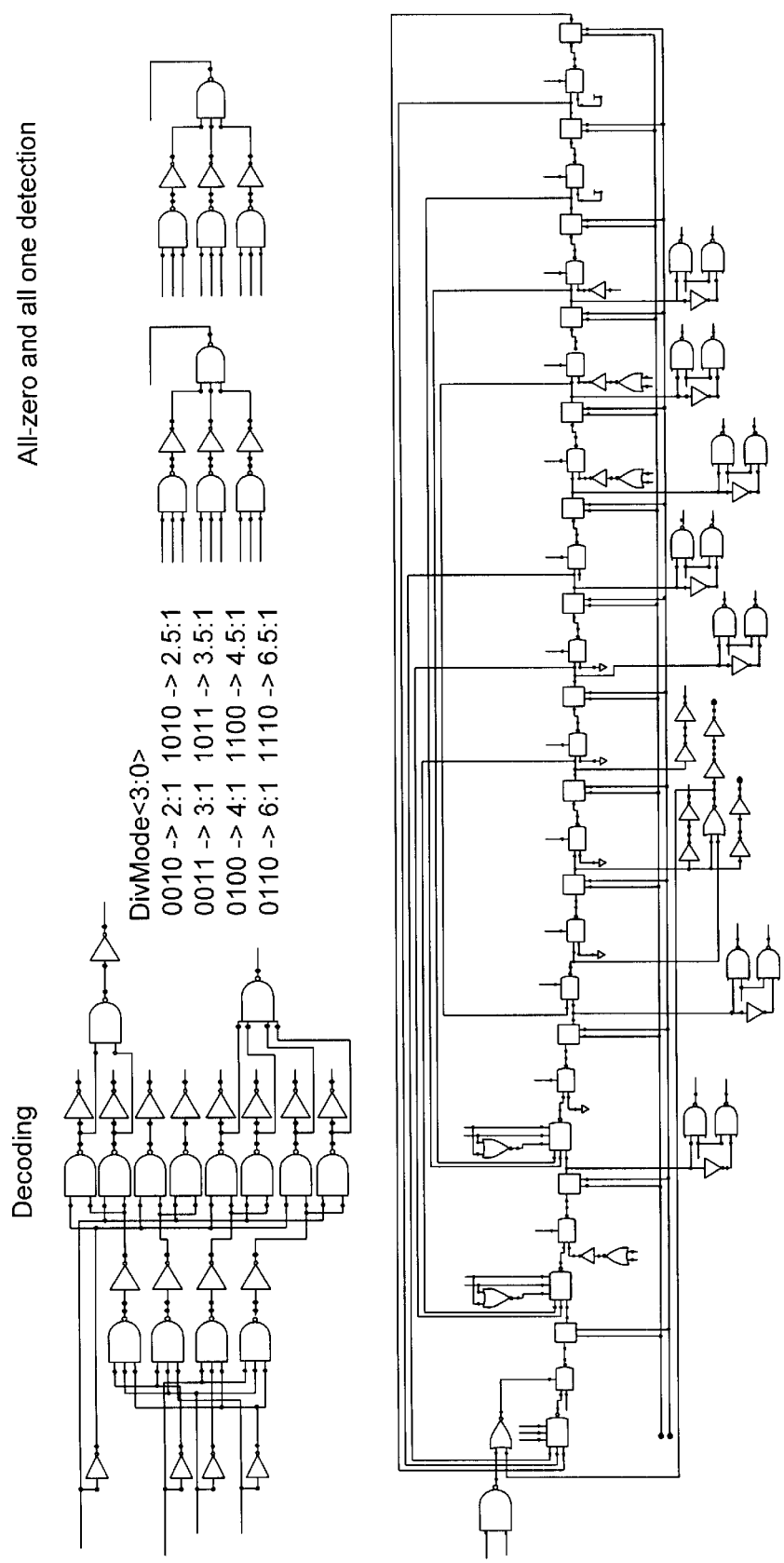
FIG. 4 Frequency Divider

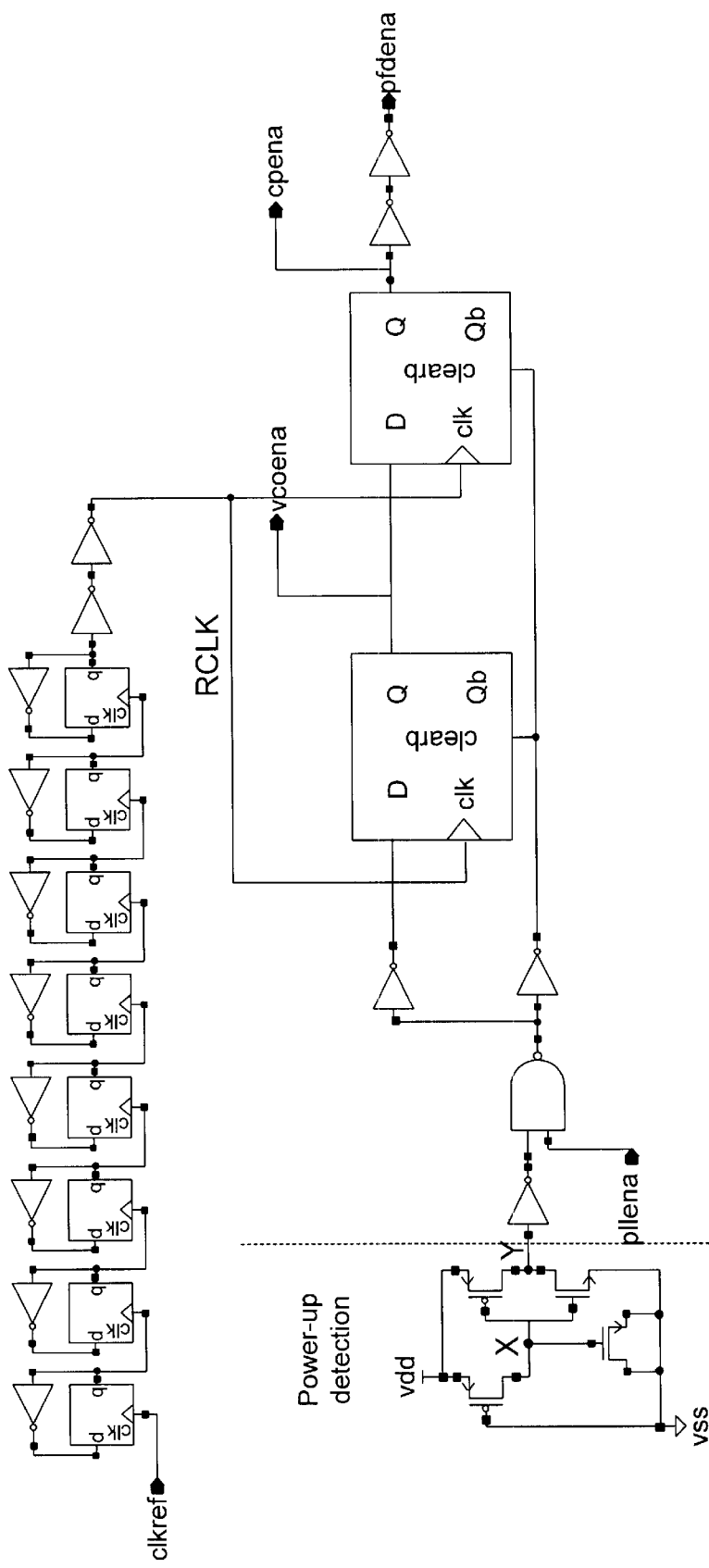
FIG. 5 PLL power-up control circuit

US 6,292,061 B1

LOW-VOLTAGE CMOS PHASE-LOCKED LOOP (PLL) FOR HIGH-PERFORMANCE MICROPROCESSOR CLOCK GENERATION

FIELD OF THE INVENTION

The invention relates to a phase-locked loop (PLL), particularly to a PLL having a differential charge pump.

BACKGROUND

Among the continuing scaling of CMOS technology toward deep submicron range, the supply voltage is scaled to 1.5V to 1.8V range at current 0.18um to 0.15um manufacturing processes. Phase-Locked Loop (PLL) is one of the most important blocks for almost all high-performance digital chips such as CPUs, DSPs, communication transmitter/receivers, etc. However, as an analog circuit, PLL's control voltage range becomes more limited as the supply voltage becomes lower. Thus, a need exists for a CMOS PLL design for low-supply voltage and high-speed clock generation.

SUMMARY

The invention provides a CMOS phase-locked loop (PLL) design for low-supply voltage and high-speed clock generation.

Preferably, a PLL with a supply voltage Vdd includes a voltage controlled oscillator (VCO. The PLL also includes a loop filter coupled to the VCO. The loop filter has MOSFET gate capacitors with a process dependent threshold voltage of approximately Vth. Additionally, the loop filter has a first filter terminal with a first filter terminal voltage of Vf1 and a second filter terminal with a second filter terminal voltage of Vf2. The PLL further includes a differential charge pump (CP) coupled to the loop filter, wherein the differential CP senses the threshold voltage Vth and maintains at a node a common-mode reference voltage of Vref that is approximately equal to (Vdd-Vth)/2. The differential CP has a common-mode feedback for centering Vf1 and Vf2 around Vref.

BRIEF DESCRIPTION OF THE FIGURES

FIG. 1 shows a typical application of a PLL used in clock generation for digital chips such as CPU, DSP, etc. PLL helps to generate a higher frequency clock for the chip internal core (frequency multiplication) and align I/O bus clock with the reference clock SysClock input from the board.

FIG. 2 shows the block diagram of a typical charge-pump PLL implementation in which CP is PFD is the phase frequency detector, CP the charge-pump, LPF the low-pass filter, VCO the voltage-controlled oscillator, D2S the differential to single-ended translator, REF & BIAS the reference and biasing circuit. The top RCV is receiver in I/O pad and the bottom is used for delay match.

FIG. 3 shows the differential charge-pump and loop filter. The diode-connected MOSFET m129 has a large W/L ratio and senses the threshold voltage of the NMOS transistor. LPF consists of poly resistors and NMOS transistors biased in strong inversion. cpena resets the initial differential loop filter voltage and setfo sets the loop filter voltage at zero.

FIG. 4 is the frequency divider. All-zero and all-one detection is used to prevent the divider "hard" failures. The divider sets the initial state every state cycle, which can correct or modify) the divide-mode in one system clock cycle. Different feedback taps enable the high-speed operation by reducing the critical path delay.

FIG. 5 shows how the control signals are generated to control the VCO start-up, the charge-pump enable and the loop close at pfdena.

DETAILED DESCRIPTION

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

General Operation of Phase Locked Loop

FIG. 1 shows a block diagram of Phase Locked Loop (PLL) 100 used for clock generation. The major components of a charge-pump PLL are Phase Frequency detector (PFD), Charge Pump (CP) 110, Low Pass Filter (LPF) 115, Voltage Controlled Oscillator (VCO) 120, and frequency divider 125. A board clock is input to the chip pad and used as reference clock input (SysClock) 130 to the PFD 105. SClk 135 is the on-chip clock generated from VCO 120 and divided by the frequency divider 125. PFD 105 compares SysClock 130 and SClk 135, and issues control signals UP/DN depending on which signal arrives early. CP 110 converts the voltage control signals UP/DN into current pulse IP which is filtered by the LPF 115. VC is the control signal generated from LPF 115 and is used to control the VCO oscillation frequency. The high-frequency clock of VCO output is then divided by the divide_by_N frequency divider. PLL 100 serves as a frequency multiplier and timing alignment circuit for the chip interfacing.

Functional Operation of the PLL

Shown in FIG. 2 is the top-level block diagram of a differential charge pump PLL 110. In addition to FIG. 1, D2S 210 is the circuit translating the differential signals into the single-ended, REF & BIAS 225 generates the reference and biasing currents, PLL parameter control block generates the control signals to control the PLL start-up and to set the PLL loop parameters for different divide mode. The differential operation is noted on the diagram of complementary signals, such as IP+, IP−, etc. In FIG. 3 (CP block in FIG. 1), a novel differential charge pump circuit is developed. Process compensation which is very important to deep submicron CMOS operating under lower supply voltage is realized through a threshold voltage sensing technique for the common-mode reference setting. When the supply voltage is low, the available useful voltage range of analog control is very limited. The invented charge pump circuit maximizes this control voltage range. FIG. 4 is the programmable frequency divider (Programmable divider in FIG. 2) developed for high frequency applications. This frequency divider can also support divide-mode change-on-flight by all-zero/all-one detection and divider self-correction. PLL start-up is totally controlled by the control circuit shown in FIG. 5. Through such a control scheme, PLL can power up very robustly.

Description of the Invented Charge Pump Circuit

A differential charge pump circuit 110 and the associated loop filter 115 are shown in FIG. 3. Four functional subcircuits can be identified. The common-mode feedback circuit consists of transistors m1A, m1B, m1C, m1D, m8B, m8C, m9B, m9C, m45, m10A, and m11A. Common-mode reference and filter voltage preset are finished by resistors R1A, R2A, R1B, R2B, and transistors m129, m101, m102 and m103. Charge pumping is done by transistors m2A, m2B, m2C, m2D, m8D, m8E, m9D, m9E, m10B, m10C, m11B, and m11C. Loop filter 115 consists of MOSFET capacitors C1F1, C1F2, C3F1, C3F2, and resistors RFILTER1 and RFILTER2. Cross-coupled differential pairs m1A, m1B and m1C and m1D measure the common-mode voltage at filter terminals F1 and F2, compares it to the voltage at node X0, adjust the circuit biasing through m10A and m11A such that the average voltage at terminal F1 and F2 equals to the reference voltage at node X0. MOSFET gate capacitors C1F1, C1F2, C3F1, and C3F2 are voltage-dependent non-linear capacitors, but, in CMOS, they are cheaper than any other capacitors if available at all. Using MOSFET capacitors to implement PLL loop filter 115 requires good control of the MOSFET capacitor gate voltage such that the capacitors operate in the linear range. As shown in FIG. 3, NMOS transistors are used as loop filter capacitors C1F1, C1F2, C3F1, and C3F2. The requirement of these capacitors linear operation is that the terminal voltages at F1 and F2 are always greater than the NMOS transistor threshold voltage VTH, i.e., the voltages at F1 and F2 can only vary within VDD−VTH, where VDD is the chip supply voltage.

The common-mode reference voltage at X0 are determined by R1A, R1B, R2A and R2B. Transistor m129 is designed with very large channel width and resistors are selected such that the current through the resistor branch is relatively small. Since the channel width of m129 is large and the current flowing through the diode-connected m129 is small, the drain voltage of m129 at node XD approximately represents the NMOS transistor threshold voltage VTH. In other words, m129 is designed to sense the NMOS threshold voltage of a particular semiconductor manufacturing process. The resistors are designed such that R1A=R1B and R2A=R2B. By this arrangement, the node voltage at X0 is equal to (VDD−VTH)/2 which is the middle point of the linear range of NMOS capacitors. Transistors m102 and m103 enable the charge pump. When m102 and m103 are ON and m101 is OFF, filter terminal voltage at F1 is equal to the voltage at node XA, and the voltage at F2 is equal to the voltage at node XB. The equivalent VCO control voltage is equal to the difference of voltages of F2 and F1. Since the XB voltage is always lower than XA voltage, the VCO control voltage is preset at a negative value. The differential voltage of VCO control is zero when the VCO is free running which can be set by turning m101, m102 and m103. Before the charge pump 110 is enabled, the VCO control voltage is initialized at a differential negative value to help the VCO oscillation start-up. More explanation is given in the description of PLL start-up about this feature.

Referring still to FIG. 3, the differential charge pumping is realized by the cross-coupled differential pairs m2A, m2B, m2C and m2D. m10B, m11B and m10C, m11C together with m10A, m11A form low-voltage cascade current mirrors. To make the maximum use of loop filter capacitor linear range, the gate-to-source voltage of m11B, m11C through vp are biased to a relatively small value but in saturation range. Since one VTH is subtracted from the node voltages at F1 and F2, biasing of m8B, m8C, m8D, m8E, and m9B, m9C, m9D, m9E through vn1, vn2 can be easily determined. Pin cpena controls the charge pump enable. Pin setfo is used to preset the loop filter control voltage at differential zero, so that VCO 120 will run at free running frequency.

Description of Frequency Divider:

FIG. 4 shows the detailed schematic of the developed frequency divider 125. In this implementation, the divide mode can be set to 2N, where N is one of 2, 2.5, 3, 3.5, 4, 4.5, 6, 6.5. In other words, the divider 125 can be programmed to one of eight divide modes—4, 5, 6, 7, 8, 9, 12, 13. As explained in the general description, high speed is the basic requirement for the frequency divider 125. The frequency divider 125 shown in FIG. 4 is a shift register type divider. The novel feature of this divider 125 is the nested feedbacks to the distributed multiplexes, which reduce the time delay of the critical path in conventional approach (an 8-to-1 mux at the entry for programmability). Following table shows the nested feedback configuration.

TABLE 1

Frequency Divider Configuration

| div. mode | DFF1 | DFF2 | DFF3 | DFF4 | DFF5 | DFF6 | DFF7 | DFF8 | DFF9 | DFF10 | DFF11 | DFF12 | DFF13 |
|---|---|---|---|---|---|---|---|---|---|---|---|---|---|
| /13 | 1 | 1 | 1 | 1 | 0 | 0 | 0 | 0 | 0 | 0 | 0 | 1 | 1 |
| /12 | 1 | 1 | 1 | 1 | 0 | 0 | 0 | 0 | 0 | 0 | 1 | 1 | x |
| /9 | x | x | 1 | 1 | 0 | 0 | 0 | 0 | 0 | 1 | 1 | x | x |
| /8 | x | x | 1 | 1 | 0 | 0 | 0 | 0 | 1 | 1 | x | x | x |
| /7 | 0 | 1 | 1 | 1 | 0 | 0 | 0 | x | x | x | x | x | x |
| /6 | x | x | x | 1 | 0 | 0 | 0 | 1 | 1 | x | x | x | x |
| /5 | x | 0 | 1 | 1 | 0 | 0 | x | x | x | x | x | x | x |
| /4 | x | 0 | 1 | 1 | 0 | x | x | x | x | x | x | x | x |

In Table 1, the first column is divide mode selection, "0" means the initial state of the D flip-flop (DFF) is at low voltage, "1" means the initial state is at high voltage, and "x" means the corresponding DFF is not included in the divider for a specific divide mode, that is, only the DFFs with either "0" or "1" initial state form the divider. The initial states of all DFFs are set through the MUXes sitting in front of the DFFs, i.e., synchronous set. As seen from Table 1, DFFs can be assigned to different initial states, some of the DFFs' initial state are selected through the decoding of the divide mode, e.g., DFF2 is initialized to "0" for divide ratio 4 or 5, and to "1" for divide ratio 7, 12 or 13.

The frequency divider self-correction is done through the initial state set for every divider cycle. For example, for divide-by-4 mode, the initial state is 0110 of DFF2, DFF3, DFF4 and DFF5, and this state will be repeated for every four clock cycles. Once the initial state is back, the divider resets the divider to the initial state. If the divide mode is the same as before, the divider output is smooth and circuit operates as a usual counter. If the divide mode has been changed, the divider operates to the new divider mode through this reset and so self-correction. For example, if divide mode has been changed from 4 to 6, the divider output looks like as following if we use the divider clock as timing reference

... 11001100111000111000 ...

This self-correction technique make it possible of divide-mode change-on-flight.

For divide-by-k mode, k DFFs are used in the shift register loop. As we know, there are 2^k possible states and only k states are legal for a divide-by-k, e.g., for divide-by-6, 6 slates are used, and 2^6−6=58 states are illegal. Self-correction described above and the all-zero/all-one detection help to prevent the divider staying in these illegal states. As an example, if we want a divide-by-6 and the initial state of the divider is set at 111101, what we see at the output looks like

1111011100011000 ...

The divider corrects itself after 6 clock cycles. During power-up, the divider can also be in the state of all zeros or all ones of the DFFs. To prevent the divider staying in the all-zero/all-one state forever, all-zero/all-one detection circuits set the initial state once such situation is detected. The decoding is related to the divide definition given in the figure.

Description of the Power-up Control:

Process variations make a deep-submicron PLL design challenging. To have the PLL work robustly, the controlled start-up of PLL is devised so that PLL can starts operation under all operation conditions. As shown in FIG. 5, RCLK is the output of ring counter and its frequency is 256 times less than that of the reference clock clkref input to the PFD. The clock period TRCLK=256*Tclkref.

The power-up detection portion consists of mC1, m2, m3 and m4. Transistor mC1 is used as a capacitor, and transistor m2 is designed with long channel and used as a resistor. m2 and m1C form an RC low pass filter. Transistors m3 and m4 form an inverter with weak pull-down m4. When the power is up, VDD through m2 charges the m1C and voltage at node X goes up. Once the voltage at node X reaches the threshold of m3, m4 inverter, m4 pulls down the voltage at node Y. Since m4 is weak, the inverter threshold is closer to VDD and node Y can only be pulled down when the voltage at node X is high enough. When the power is detected as up, pllena is asserted, and the reference clock is input to the chip and runs 256 cycles (rising edge of RCLK appears), the control signal vcoena is sent out to start the VCO oscillation at a lower frequency controlled by the preset filter voltage. At this time, PLL is still in open loop condition, and VCO is free running. The loop waits another 256 reference clock cycles to enable the charge pump (cpena goes high) and shortly closes the PLL loop by issuing the control signal pfdena. In summary, PLL components are enabled sequentially and loop is only closed when all components are set to the predefined condition. This way, PLL always starts the operation under the strict controlled condition, which avoids the random start-up and possible positive feedback of making the PLL dead.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A phase-locked loop (PLL) with a supply voltage Vdd, said PLL comprising:

a voltage controlled oscillator (VCO);

a loop filter coupled to said VCO, said loop filter having a plurality of MOSFET gate capacitors with a process dependent thresh-hold voltage of approximately Vth, said loop filter having a first filter terminal with a first filter terminal voltage of Vf1 and a second filter terminal with a second filter terminal voltage of Vf2;

a differential charge pump (CP) coupled to said loop filter, wherein said differential CP is adapted to sense said thresh-hold voltage Vth and maintain at a node a common-mode reference voltage of Vref approximately equal to (Vdd−Vth)/2, and wherein said differential CP has a common-mode feedback for centering Vf1 and Vf2 around Vref.

2. The PLL of claim 1, wherein said plurality of MOSFET gate capacitors have a linear gate voltage range from Vth to Vdd, said linear gate voltage range having a center at Vref.

3. The PLL of claim 1, wherein said VCO has a control voltage that is approximately equal to Vf1−Vf2.

4. The PLL of claim 3, wherein said VCO is free running when said control voltage is set to zero.

* * * * *